(12) United States Patent
Ataka et al.

(10) Patent No.: US 8,773,141 B2
(45) Date of Patent: Jul. 8, 2014

(54) TEST APPARATUS AND CIRCUIT MODULE

(75) Inventors: Tsuyoshi Ataka, Gunma (JP); Shoji Kojima, Gunma (JP)

(73) Assignee: Advantest Corporation, Tokyo (JP)

( * ) Notice: Subject to any disclaimer, the term of this patent is extended or adjusted under 35 U.S.C. 154(b) by 421 days.

(21) Appl. No.: 13/082,386

(22) Filed: Apr. 7, 2011

(65) Prior Publication Data
US 2012/0119752 A1 May 17, 2012

Related U.S. Application Data

(63) Continuation-in-part of application No. PCT/JP2009/005393, filed on Oct. 15, 2009.

(30) Foreign Application Priority Data

Oct. 28, 2008 (JP) .................................. 2008-276899

(51) Int. Cl.
G01R 31/02 (2006.01)
(52) U.S. Cl.
USPC ...... 324/537; 324/500; 324/750.01; 361/704; 165/80.4; 165/83
(58) Field of Classification Search
USPC .................. 324/537, 340, 500; 165/80.4, 83; 361/704
See application file for complete search history.

(56) References Cited

U.S. PATENT DOCUMENTS

| | | | | |
|---|---|---|---|---|
| 6,184,053 | B1 * | 2/2001 | Eldridge et al. | 438/52 |
| 6,891,385 | B2 * | 5/2005 | Miller | 324/750.08 |
| 7,911,792 | B2 * | 3/2011 | Liang et al. | 361/699 |
| 2004/0193989 | A1 * | 9/2004 | Welbon et al. | 714/742 |
| 2005/0199816 | A1 * | 9/2005 | Amemiya et al. | 250/363.05 |
| 2008/0099909 | A1 * | 5/2008 | Baek et al. | 257/715 |
| 2008/0303138 | A1 * | 12/2008 | Flett | 257/714 |

FOREIGN PATENT DOCUMENTS

| | | | |
|---|---|---|---|
| EP | 1653510 A2 * | 5/2006 | |
| JP | H07-45761 A | 2/1995 | |
| JP | 2002-280507 | * | 9/2002 |
| JP | 2002-280507 A | 9/2002 | |
| JP | 2007-322372 A | 12/2007 | |
| WO | 2005/004571 A1 | 1/2005 | |

OTHER PUBLICATIONS

IPCOM000024958D, An integral grounding brush, IP.com Prior Art Search, Apr. 4, 2004, pp. 33-34.*
International Search Report (ISR) issued in International application No. PCT/JP2009/005393 with a completion date of Dec. 25, 2009.

(Continued)

*Primary Examiner* — Vinh Nguyen
*Assistant Examiner* — Giovanni Astacio-Oquendo

(57) ABSTRACT

Provided are a first test substrate and a second test substrate opposing each other, a first test circuit testing a device under test and being disposed on a face of the first test substrate that faces the second test substrate, a second test circuit testing the device under test and being disposed on a face of the second test substrate that faces the first test substrate, and a sealing section that is formed by sealing a space between the first test substrate and the second test substrate to enclose the first test circuit and the second test circuit in a common space that is filled with coolant.

12 Claims, 15 Drawing Sheets

(56) References Cited

OTHER PUBLICATIONS

Translation of the International Preliminary Report on Patentability issued in International application No. PCT/JP2009/005393 mailed on Jun. 16, 2011.
KIPO Office action for application No. 10-2011-7005308, dated May 25, 2012.
Notice of Second Office Action for Chinese Patent Application No. 2009801426102, issued by the State Intellectual Property Office of China on Sep. 26, 2013.
Notification of Reasons for Refusal of Japanese Patent Application No. 2010-535637, issued by the Japanese Patent Office on Sep. 10, 2013.

\* cited by examiner

VI-VI

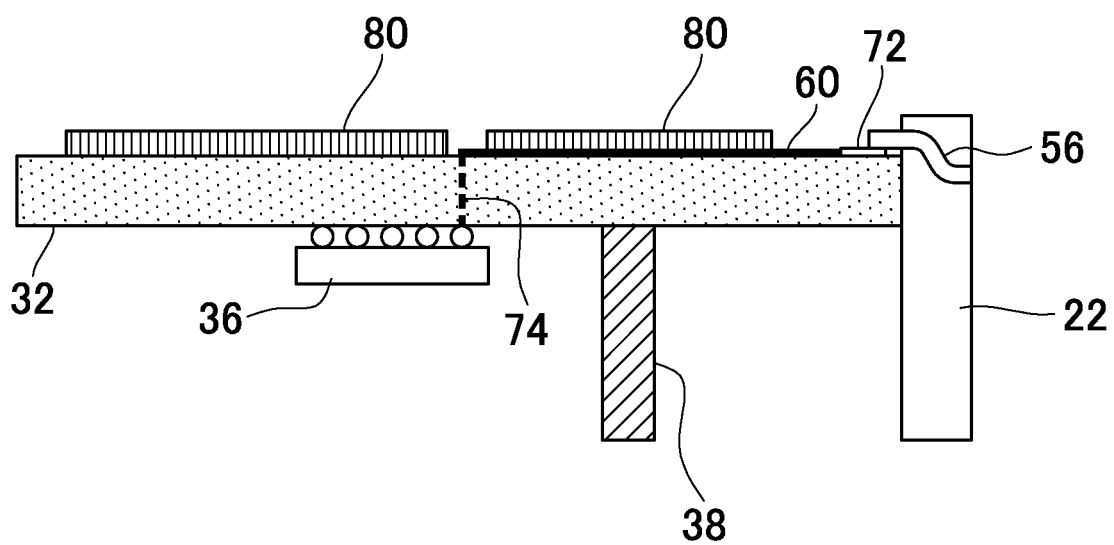
F I G . 9

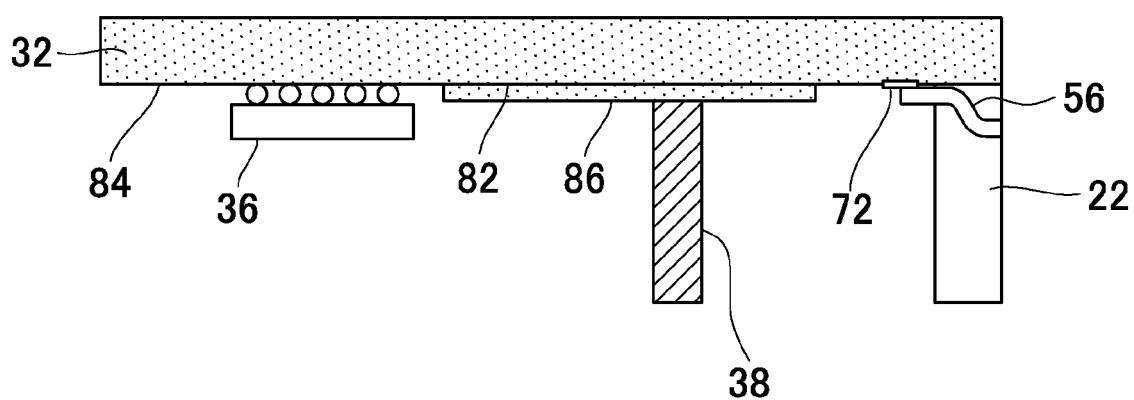
F I G. 12

TEST APPARATUS AND CIRCUIT MODULE

BACKGROUND

1. Technical Field

The present invention relates to a test apparatus and a circuit module.

2. Related Art

Semiconductor devices included in electronic circuits generate heat when they operate. The amount of heat generated by semiconductor devices are increasing as operation speeds of the semiconductor devices have been increasing and circuits are more densely integrated with the recent years' development. Accordingly, it is essential to cool a plurality of semiconductor devices mounted on a test substrate. In a semiconductor test apparatus, for example, a multi-layered test substrate on which electronic circuit elements such as semiconductor devices are mounted is covered with a fluid casing, and coolant is circulated within the fluid casing to cool the semiconductor devices on the test substrate (see Patent Document 1). Here, Patent Document 1 is Japanese Patent Application Publication 2002-280507.

FIG. 14 illustrates a conventional method to cool a test substrate on which electronic circuit elements such as semiconductor devices are mounted. Referring to FIG. 14, a multi-layered test substrate 100 is formed of insulating plates 102, 103 that are made of epoxy resin or the like and bonded to each other with prepreg 104 such as a glass fiber substrate. Electronic circuit elements including a semiconductor device 106 are provided on the both sides of the test substrate 100. The test substrate 100 is coupled to another test substrate via a connector 108. In order to mitigate temperature elevation due to the heat generated by the semiconductor devices 106, a fluid casing 110 is provided to attach to the test substrate 100, and the semiconductor device 106 is cooled with coolant such as fluorine-based liquid which is filled within an enclosed space 112 between the test substrate 100 and the fluid casing 110.

FIG. 15 is an enlarged view of a portion including the connector 108 shown in FIG. 14. Referring to FIG. 15, the semiconductor device 106 is coupled to a terminal 114 of the connector 108 via a first wiring line 116 that is formed of a copper foil or the like and provided on a surface of the insulating plate 102, a penetrating through-hole 120, a second wiring line 118 that is provided within the layer of the insulating plate 102, a penetrating through-hole 121, a third wiring line 117 that is provided on the surface layer of the insulating plate 102, and a connection terminal 122. In the same manner, a wiring line 119 is provided inside the layer of the insulating plate 103. When the wiring line 118 and the wiring line 119 are disposed closely to each other, cross-talk occurs between the wiring line 118 and the wiring line 119. In order to secure a certain distance between the wiring line 118 and the wiring line 119, the wiring line 118 and the wiring line 119 are formed inside the insulating plate 102 and the insulating plate 103 respectively rather than the interfaces between the prepreg 104 and the insulating plates 102 and 103.

However, when the wiring line 118 is formed inside the insulating plate 102, a stub can be formed between an intersection of the penetrating through-hole 120 and the wiring line 118 and an intersection of the penetrating through-hole 120 and the prepreg 104. Stub formation creates a problem that signal waveforms are deformed due to the effect of reflection at edges of the penetrating through-hole 120.

In addition, there will be another problem such that high-frequency components of the deformed signals are emitted to the outside of the test substrate 100 as noise. Particularly when the frequency of the transmitted signal exceeds 2 GHz, the adverse effects of the above-stated problems caused by the stub becomes pronounced. By using a surface via hole (SVH) and an inner via hole (IVH), it is possible to avoid cross-talk and a stub from being generated. However, providing SVHs and IVHs is an expensive process so that the manufacturing cost of the test substrate will be increased.

SUMMARY

Therefore, it is an object of an aspect of the innovations herein to provide a detection apparatus and a circuit module, which are capable of overcoming the above drawbacks accompanying the related art. The above and other objects can be achieved by combinations described in the claims. A first aspect of the innovations may include a test apparatus for testing a device under test. The test apparatus includes a first test substrate and a second test substrate that are arranged to face each other, a first test circuit that tests the device under test and is disposed on a face of the first test substrate that faces the second test substrate, a second test circuit that tests the device under test and is disposed on a face of the second test substrate that faces the first test substrate, and a sealing section that is formed by sealing a space between the first test substrate and the second test substrate to enclose the first test circuit and the second test circuit in a common space that is filled with coolant.

A second aspect of the innovations may include a circuit module that outputs an output signal corresponding to an input signal. The circuit module includes a first circuit substrate and a second circuit substrate that faces each other, a first operation circuit that is provided on a side of the first circuit substrate opposing the second circuit substrate, and that outputs the output signal corresponding to the input signal, a second operation circuit that is provided on a side of the second circuit substrate opposing the first circuit substrate, and that outputs the output signal corresponding to the input signal, and a sealing section that is formed by sealing a space between the first circuit substrate and the second circuit substrate to enclose the first operation circuit and the second operation circuit in a common space that is filled with coolant.

The summary clause does not necessarily describe all necessary features of the embodiments of the present invention. The present invention may also be a sub-combination of the features described above.

BRIEF DESCRIPTION OF THE DRAWINGS

FIG. 9 is a side perspective view of a circuit module 30 according to a second embodiment.

FIG. 12 is a side perspective view of a circuit module 30 according to a fifth embodiment.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
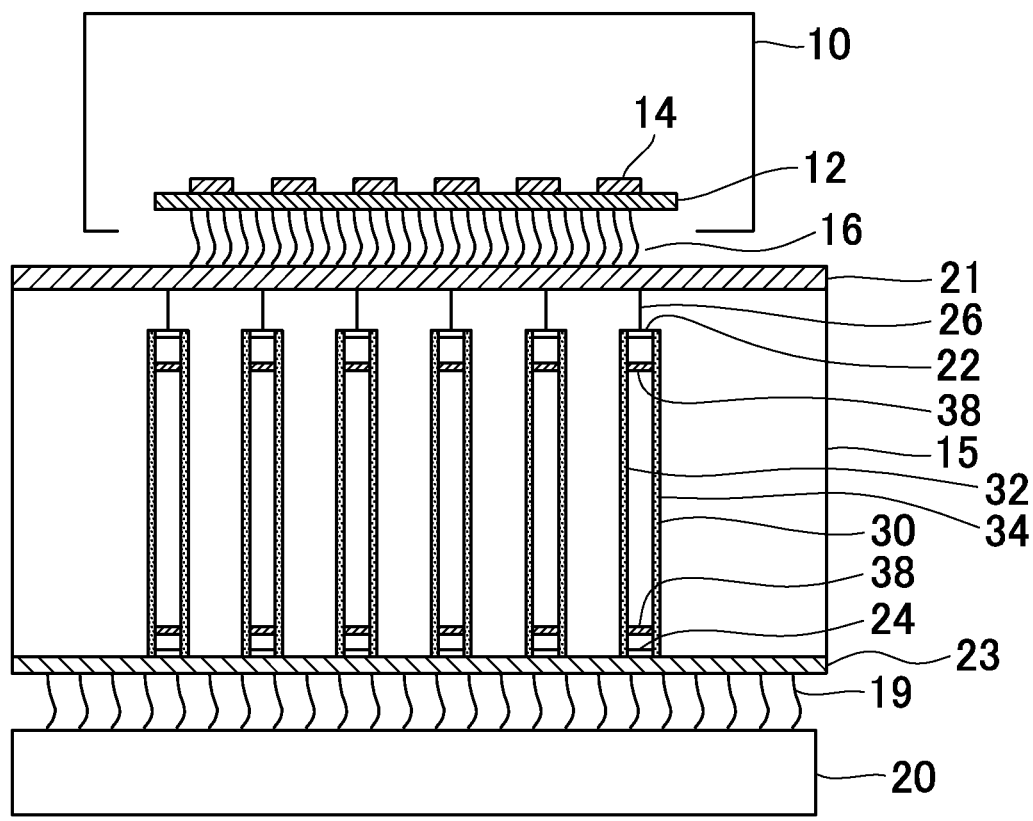
FIG. 1 illustrates a configuration example of a semiconductor device test apparatus 1, which is an embodiment of a test apparatus according to the invention.

FIG. 1 illustrates a configuration example of a semiconductor device test apparatus 1, which is an embodiment of a test apparatus according to the invention. The semiconductor device test apparatus 1 includes a handler 10, a test head 15 and a control section 20. The handler 10 includes a socket substrate 12 on which a socket 14 is provided, and a device under test is mounted on the socket 14. The socket substrate 12 is coupled to a test head 15 via a first cable 16. The test head 15 is coupled to the handler 10 via a performance board 21 and the first cable 16, and also coupled to the control section 20 via a backboard 23 and a second cable 19. More than one circuit module 30 is provided inside the test head 15.

Each circuit module 30 has two test substrates, a first test substrate 32 and a second test substrate 34 on which elements such as semiconductor devices included in electronic circuits are mounted. Each circuit module 30 is coupled to the handler 10 via a connector 22, a connection cable 26, the performance board 21 and the first cable 16. The circuit module 30 is also coupled to the control section 20 via a connector 24, a back board 23 and the second cable 19. The control section 20 controls test circuits included in the test substrates via the second cable 19. Although six circuit modules 30 are provided inside the test head 15 in the example shown in FIG. 1, the number of the circuit modules 30 can be increased or decreased depending on the number of the sockets 14 provided in the handler 10.

Figure 2:
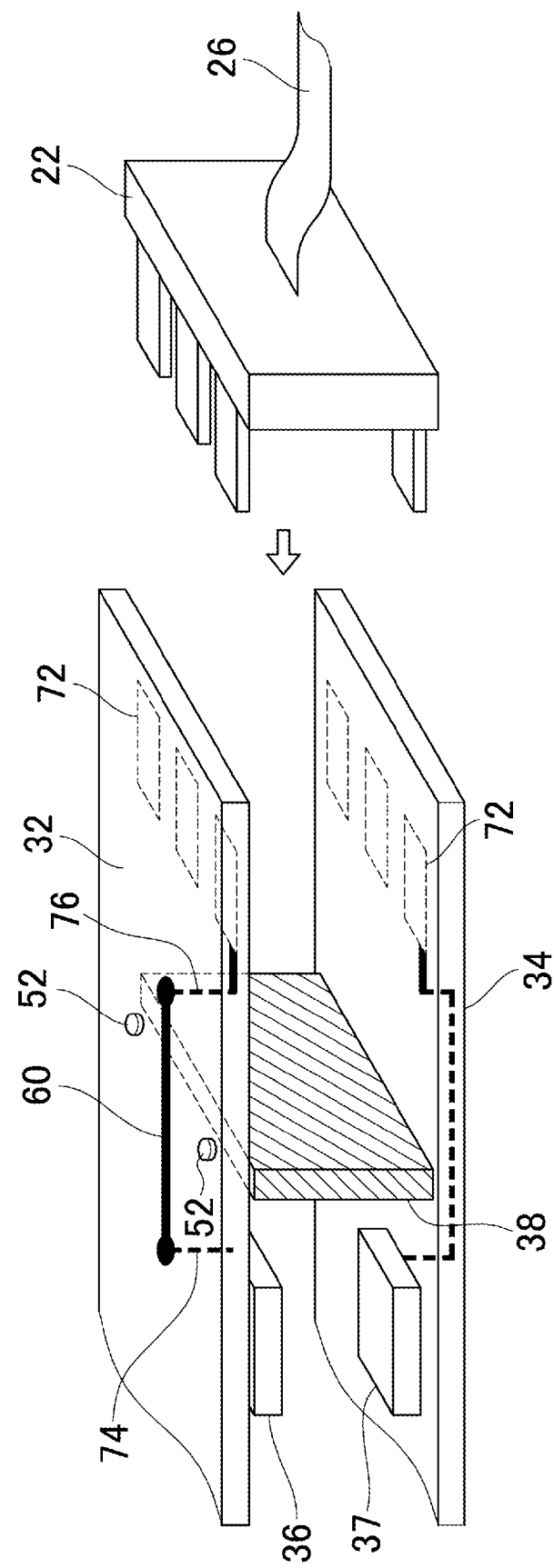
FIG. 2 is a perspective view of a portion of a circuit module 30.
Figure 3:
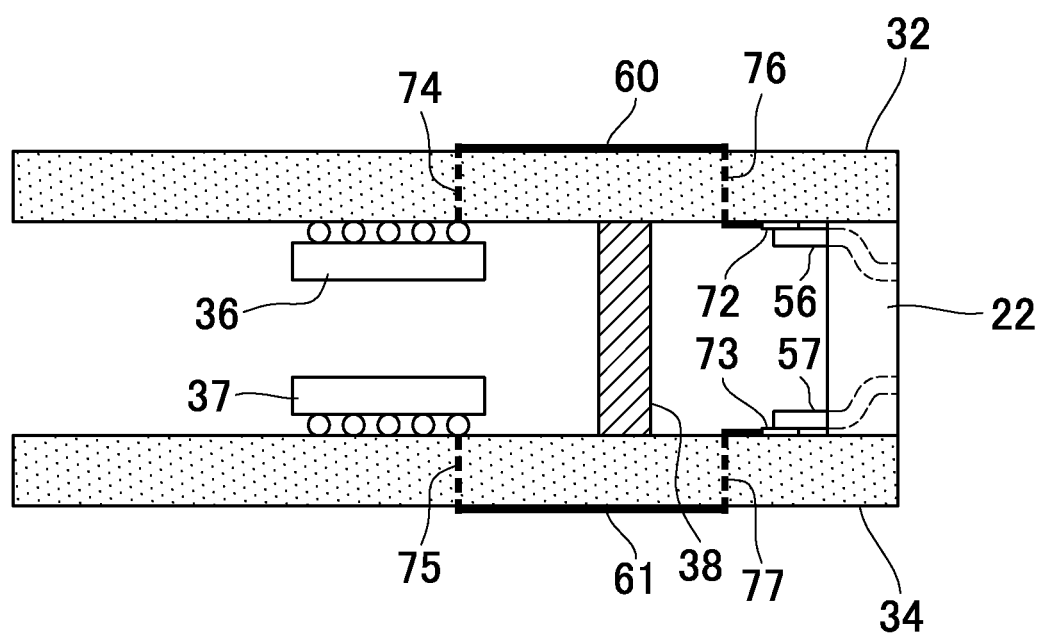
FIG. 3 is a side perspective view of a portion of the circuit module 30.

FIG. 2 is a perspective view of a portion around the connector 22 in the circuit module 30. FIG. 3 is a side perspective view of the portion shown in FIG. 2. Referring to FIG. 2 and FIG. 3, the first test substrate 32 and the second test substrate 34 respectively have a back-side wiring line 60 on their back sides opposite the sides on which the first test circuit 36 and the second test circuit 37 are disposed. The first test substrate 32 further has a first through-hole 74 that extends from the surface on which the test circuit is provided to the surface on which the back-side wiring line 60 is provided. With the first through-hole 74, the first test circuit 36 is electrically coupled to the back-side wiring line 60. The second test substrate 34 also has a back-side wiring line 61 and a first through-hole 75 which are similar to the above-mentioned ones. The first test circuit 36 and the second test circuit 37 supply signals to the device under test and measure response signals output by the device under test. The first test circuit 36 and the second test circuit 37 may include pattern generators, formatters, comparators, and logical circuits.

The first test substrate 32 and the second test substrate 34 are formed such that their edges are situated outside the region enclosed by sealing section 38. The back-side wiring line 60 and the back-side wiring line 61 extends from a region corresponding to the inside of the sealing section 38 to the outside of the sealing section 38 on the back sides of the first test substrate 32 and the second test substrate 34. The first test circuit 36 and the second test circuit 37 are provided in the region corresponding to the inside of the sealing section 38, and the connector 22 is provided in the region corresponding to the outside of the sealing section 38. The sealing section 38 is fixed to the first test substrate 32 and the second test substrate 34 with screws 52.

The first test substrate 32 has a connection terminal 72 on the surface where the first test circuit 36 is provided, and the connection terminal 72 is situated outside the sealing section 38 and is to be electrically coupled to an external circuit. The first test substrate 32 also has a second through-hole 76 that extends from the surface on which the connection terminal 72 is disposed to the surface on which the back-side wiring line 60 is provided. With the second through-hole 76, the connection terminal 72 is electrically coupled to the back-side wiring 60. In the same manner as the first test substrate 32, the second test substrate 34 has a connection terminal 73 and a second through-hole 77 formed therein. With the second through-hole 77, the connection terminal 73 is electrically coupled to the back-side wiring 61.

At an edge of the first test substrate 32 and the second test substrate 34, the connector 22 is inserted between the first test substrate 32 and the second test substrate 34. When a terminal 56 and a terminal 57 of the connector 22 respectively contact the connection terminal 72 and the connection terminal 73 which are provided on the first test substrate 32 and the second test substrate 34 respectively, the first test circuit 36 and the second test circuit 37 are electrically coupled to a circuit provided outside the circuit module 30.

Figure 4:
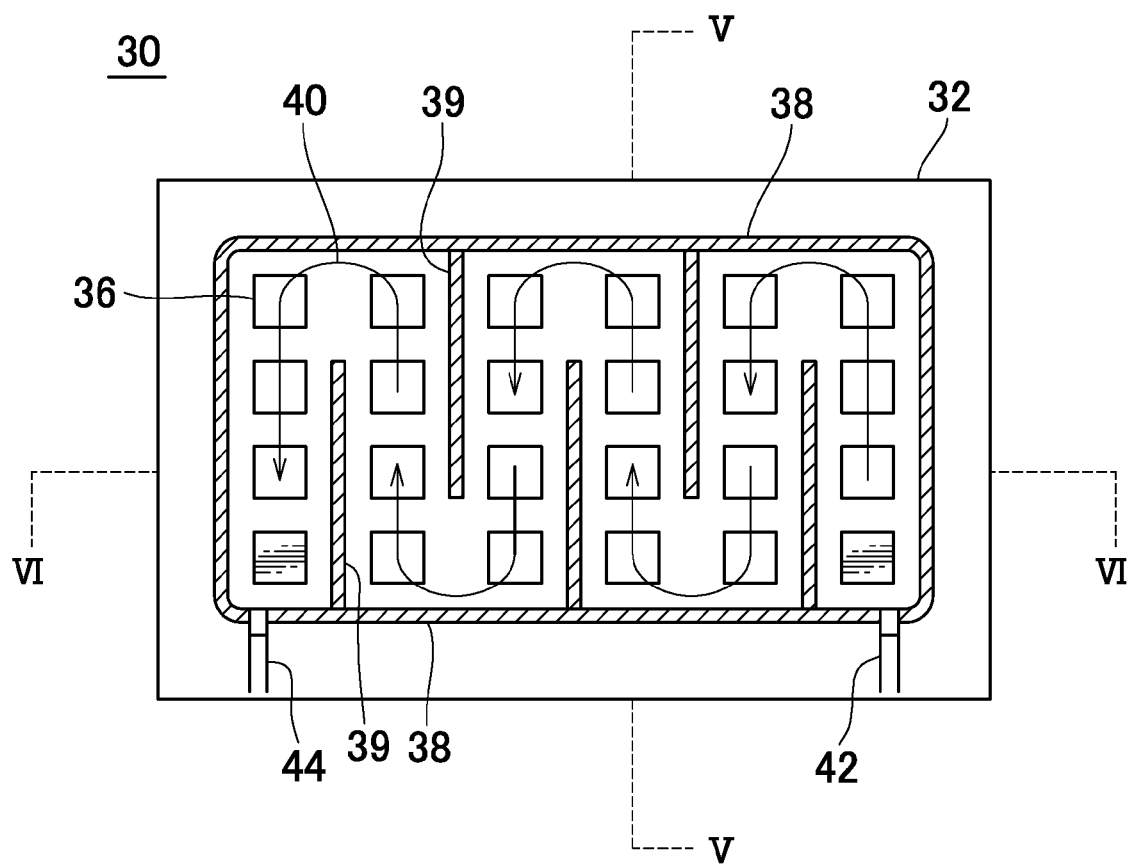
FIG. 4 illustrates a configuration example of the circuit module 30.

FIG. 4 illustrates a configuration example of the circuit module 30. FIG. 4 is a perspective view of the circuit module 30 viewing from a direction perpendicular to the test substrate that has the circuit module 30.

Figure 5:
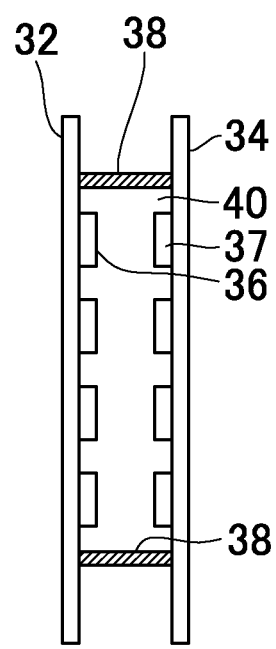
FIG. 5 shows a sectional view of the circuit module 30 along the line V-V in FIG. 4.

FIG. 5 shows a sectional view of the circuit module 30 along the line V-V in FIG. 4. In other words, FIG. 5 is a sectional view of the circuit module 30 viewing from the handler 10 or the control section 20.

Figure 6:
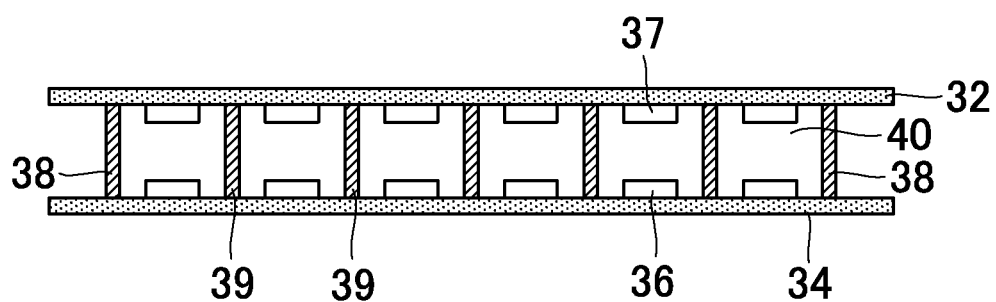
FIG. 6 shows a sectional vie of the circuit module 30 along the line VI-VI in FIG. 4.

FIG. 6 shows a sectional view of the circuit module 30 along the line VI-VI in FIG. 4. In other words, FIG. 6 is a sectional view of the circuit module 30 viewing from the front side or back side of the test head 15.

Referring to FIGS. 4 to 6, in the circuit module 30, the first test substrate 32 is provided so as to face the second test substrate 34. The first test circuit 36 for testing a device under test is provided on the side of the first test substrate 32 opposite the second test substrate 34. The second test circuit 37 for testing a device under test is provided on the side of the second test substrate 34 opposite the first test substrate 32. In the example shown in FIGS. 4 to 6, the first test circuit 36 has semiconductor devices arranged in matrix on the first test substrate 32. In the same manner, the second test circuit 37 has semiconductor devices arranged in matrix on the second test substrate 34.

Moreover, the connector 22 and the sealing section 38 are disposed between the first test substrate 32 and the second test substrate 34. The sealing section 38 is disposed between the first test substrate 32 and the second test substrate 34, and has a tube shape whose opening is disposed at ends of the sealing section 38 close to the first test substrate 32 and the second test substrate 34.

The circuit module 30 also includes a coolant flow-channel space 40 which is formed by sandwiching the sealing section 38 with the first test substrate 32 and the second test substrate 34, and which is filled with coolant. In other words, a space between the first test substrate 32 and the second test substrate 34 is sealed with the sealing section 38 to enclose the first test circuit 36 and the second test circuit 37 inside the common coolant flow-channel space 40.

In the inner space with respect to the sealing section 38, partition walls 39 are provided to extend from the first test substrate 32 to the second test substrate 34 and to form the flow channel for the coolant filled in the coolant flow-channel space 40. The partition wall 39 extends from one horizontal surface (one of the surfaces parallel to the back board 23) of the sealing section 38 toward the opposing surface of the sealing section 38 but it does not contact the opposing surface. The odd-numbered partition walls 39 that are counted from one vertical surface (one of the surfaces vertical to the back board 23) of the sealing section 38 start from one horizontal surface of the sealing section 38, and whereas the even-numbered partition walls 39 start from the other horizontal surface of the sealing section 38. In other words, the partition walls 39 extend alternatively from one horizontal surface and the other horizontal surface of the sealing section 38.

The partition walls 39 may be provided at intervals in which the semiconductor devices are arranged in matrix. In such arrangement, more than one semiconductor device can be disposed in a width direction of the flow channel which is formed with the partition walls that extend alternatively from the two opposing surface, and the flow path for the coolant which is indicated by the arrow in FIG. 4 is formed.

The partition walls 39 may be fixed to the first test substrate 32 or the second test substrate 34 by using fixing sections that include screws or the like, which will be hereunder described. By fixing the first test substrate 32 and the second test substrate 34 to the partition walls 39 with the fixing sections, deflection of the first test substrate 32 and the second test substrate 34 can be prevented. The sealing section 38 and the partition walls 39 may be formed of conductive material such as metal.

The common coolant flow-channel space 40 is filled with coolant, and the coolant flows from a coolant inlet 42 towards a coolant outlet 44 as shown in FIG. 4. The coolant flows among the first test circuits 36 and the second test circuits 37 along the coolant flow-channel space 40 which is formed by the sealing member 38 and the partition walls 39, and the elements such as semiconductor devices included in the first test circuits 36 and the second test circuits 37 are cooled.

The coolant can be circulated by attaching a coolant circulator to the coolant inlet 42 and the coolant outlet 44. Any coolant circulator can be used as long as it is capable of letting the coolant flow into the space from the coolant inlet 42 and flow out from the coolant outlet 44.

Figure 7:
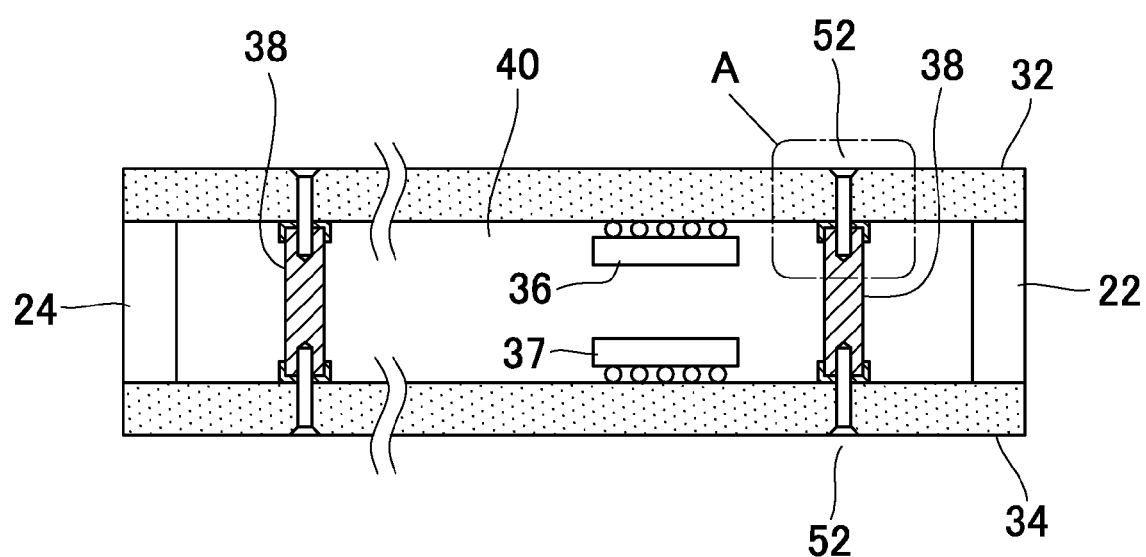
FIG. 7 is a side perspective view of the circuit module 30.

FIG. 7 is an enlarged sectional view of the circuit module 30, illustrating a fixing method for the sealing section 38. The first test substrate 32 and the second test substrate 34 are arranged such that the first test circuits 36 and the second test circuits 37 are disposed within the coolant flow-channel space 40, and they face each other with the connector 22, the connector 24 and the sealing section 38 interposed therebteween. The sealing section 38 is fixed to the first test substrate 32 and the second test substrate 34 with screws 52.

Figure 8:
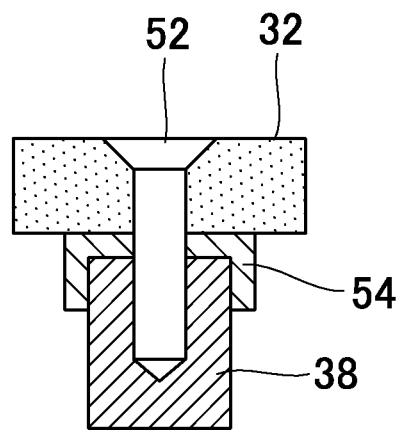
FIG. 8 is an enlarged view of a screw clamp of the circuit module 30.

FIG. 8 is an enlarged view of a fixing section that joins the first test substrate 32 and the sealing section 38. In order to avoid a gap from being formed between the side of the sealing section 38 closer to the coolant flow-channel space 40 and the side of the sealing section 38 closer to the connector 22, a gland 54 is provided between the sealing section 38 and the first test substrate 32. The first test substrate 32, the gland 54 and the sealing section 38 are screwed together with the screw 52. The joint between the second test substrate 34 and the sealing section 38 can also have the same structure as the above described screw structure. Moreover, the same screw structure can be applied to the joints between the partition walls 39 and the first test substrate 32 and the joints between the partition walls 39 and the second test substrate 34.

The gland 54 can be made from electrically-conductive material. Moreover, the first test substrate 32 and the second test substrate 34 may have metal foil such as a copper foil in the areas where these substrates are in contact with the sealing section 38 and the partition walls 39. With such metal foil, the first test substrate 32 and the second test substrate 34 are electrically connected to the sealing section 38 and the partition walls 39 via the electrically-conductive gland 54. As a result, electromagnetic waves generated by the first test circuit 36 and the second test circuit 37 are less likely to leak to the outside of the circuit module 30.

As described above, according to the embodiment, the first test circuit 36 and the second test circuit 37 are arranged so as to face each other, and thereby the back-side wiring 60 is not disposed close to the back-side wiring 61. Consequently, it is possible to prevent cross-talk between the back-side wiring 60 and the back-side wiring 61. In addition, since there is no need to provide a wiring in an inter layer of the first test substrate 32 and the second test substrate 34, no stub is generated even when the first test circuit 36 is connected to the back-side wiring line 60 via the penetrating through-hole and when the second test circuit 37 is connected to the back-side wiring line 61 via the penetrating through-hole.

FIG. 9 illustrates a circuit module 30 according to a second embodiment. The first test substrate 32 has an insulating layer 80 that covers the back-side wiring line on its surface where the back-side wiring line is formed. Whereas in the configuration shown in FIG. 2 and FIG. 3, the back-side wiring line 60 of the first test substrate 32 is exposed on the surface. In this case, electromagnetic wave generated by current passing through the back-side wiring line is emitted around the first test substrate 32 as noise.

When noise is emitted, signal waveforms of electric circuits included in other circuit modules 30 in the test head 15 are deformed and it can lead to data errors. Whereas with the insulating layer 80 that covers the back-side wiring line as shown in FIG. 9, it is possible to reduce the emission of the electromagnetic wave. Moreover, a ground electrode layer to which a ground potential is supplied can be formed on the insulating layer 80 to further reduce the emission of the electromagnetic wave.

The insulating layer 80 may cover the whole or some of the surface of the first test substrate 32 and the second test substrate 34. For example, the first test substrate 32 may have an area where the insulating layer 80 is not provided within a predefined distance from the joint between the back-side wiring line 60 and the first through-hole 74. By providing the area where the insulating layer 80 is not formed, probes of measuring instruments or the like can be used to observe waveforms of signals on the back-side wiring line 60.

Moreover, in the area where the insulating layer 80 is not formed, the connection terminal 72 that connects the terminal 56 of the connector 22 and the first test substrate 32 can be provided. The first test circuit 36 is coupled to an external electric circuit via the first through-hole 74, the back-side wiring line 60, the connection terminal 72, the terminal 56 and the connector 22.

In the same manner, the second test circuit 37 is coupled to an external electric circuit. For example, the first test circuit 36 and the second test circuit 37 may be coupled to the handler 10 via the first cable 16 and the performance board 21. Moreover, the terminal 56 of the connector 24 may be in contact with the surface of the first test substrate 32 or the second test substrate 34 on which the first test circuit 36 or the second test circuit 37 is provided.

Figure 10:
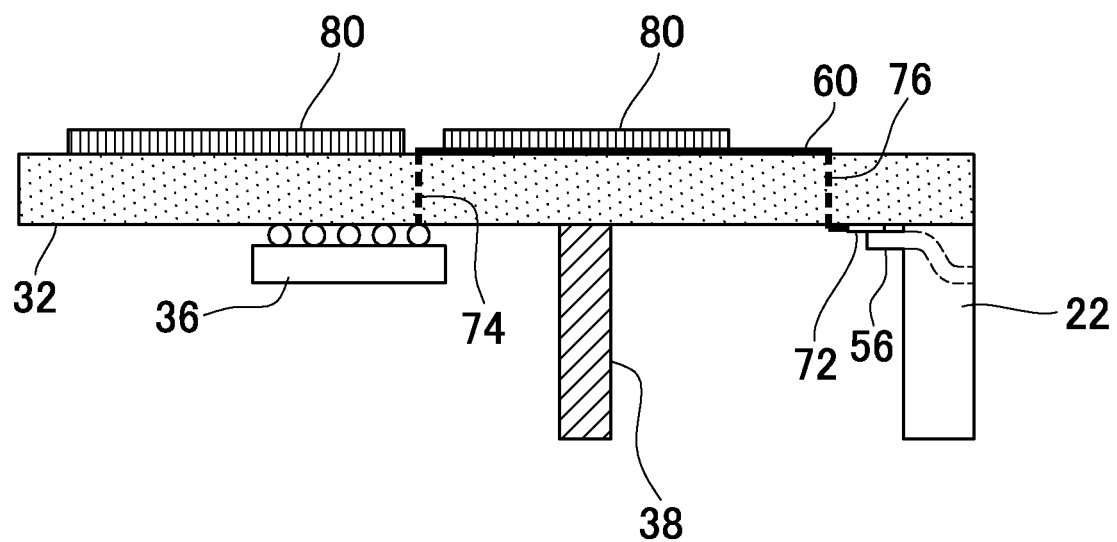
FIG. 10 is a side perspective view of a circuit module 30 according to a third embodiment.

FIG. 10 illustrates a configuration example of a circuit module 30 according to a third embodiment. In this example, the first test circuit 36 may be coupled to an external electric circuit via the first through-hole 74, the back-side wiring line 60, the second through-hole 76, the connection terminal 72, the terminal 56 and the connector 22. In the same manner, the second test circuit 37 can be coupled to an external electric circuit.

Figure 11:
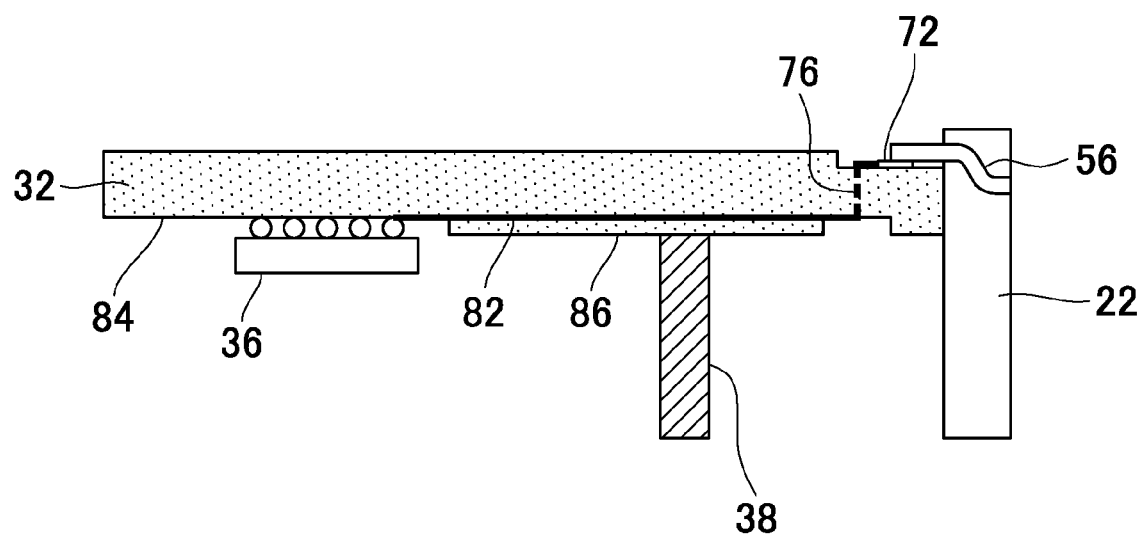
FIG. 11 is a side perspective view of a circuit module 30 according to a fourth embodiment.

FIG. 11 illustrates a configuration example of a circuit module 30 according to a fourth embodiment. The first test circuit 36 is disposed on the first test substrate 32. On the surface of a circuit mounting layer 84 on which the first test circuit 36 is mounted, a surface wiring line 82 which is electrically coupled to a terminal of the first test circuit 36 is formed. The surface wiring line 82 forms a microstrip line layer.

While in a region where the first test circuit 36 is not formed, a grounding layer 86 is formed on the circuit mounting layer 84 so as to cover the surface wiring line 82. In other words, the surface wiring line 82 forms a strip line layer, and the strip line layer extends from the inside to the outside of the sealing section 38. The grounding layer 86 has a dielectric material which has a metal foil on its surface that does not contact the surface wiring line 82, and the metal foil is grounded.

The surface wiring line 82 may be coupled to the connection terminal 72 provided on the back side of the first test substrate 32 via the second through-hole 76. With such configuration, the first test circuit 36 mounted on the circuit mounting layer 84 is coupled to an external electric circuit via the surface wiring line 82 that is covered with the grounding layer 86, the second through-hole 76, the connection terminal 72, the terminal 56 and the connector 22. The connection terminal 72 and the terminal 56 of the connector 22 can be connected by soldering.

The grounding layer 86 may cover the whole or some of the surface of the first test substrate 32. For instance, the grounding layer 86 may not be provided in a prescribed area centering on the joint between the surface wiring line 82 and the second through-hole 76. When the joint between the surface wiring line 82 and the second through-hole 76 is covered with the grounding layer 86, it may be necessary to use an expensive inner via hole (IVH) to avoid a stub from being formed. However, the surface wiring line 82 can be coupled to the connection terminal 72 without using the inner via hole (IVH) by not providing the grounding layer 86 but exposing the surface wiring line 82.

When the configuration shown in FIG. 11 is implemented, a level difference is generated between the circuit mounting layer 84 on which the first test circuit 36 is mounted and the grounding layer 86. Chip on Board (COB) masking technology can be adopted to mount the first test circuit 36 on the mounting layer around which the level difference exists. By adopting the COB masking technology, it is possible to form a metal mask having a concave-convex shape which corresponds to the concave-convex shape of the first test substrate 32 and the second test substrate 34, and then solder paste can be printed thereon.

The position in level of the area around the connection terminal 72 is different from the position in level of the other area on the back side of the first test substrate 32, creating a step on the boundary between these regions. Since the first test substrate 32 has this level difference, it is possible to place the back side of the first test substrate 32 at substantially the same position as the edge of the connector 22.

FIG. 12 illustrates a configuration example of a circuit module 30 according to a fifth embodiment. In this example, the first test substrate 32 does not have the second through-hole 76, but the connection terminal 72 is formed on the end of the surface wiring line 82. The terminal 56 of the connector 22 contacts the connection terminal 72 and thereby the first test circuit 36 is electrically connected with an external electric circuit.

Figure 13:
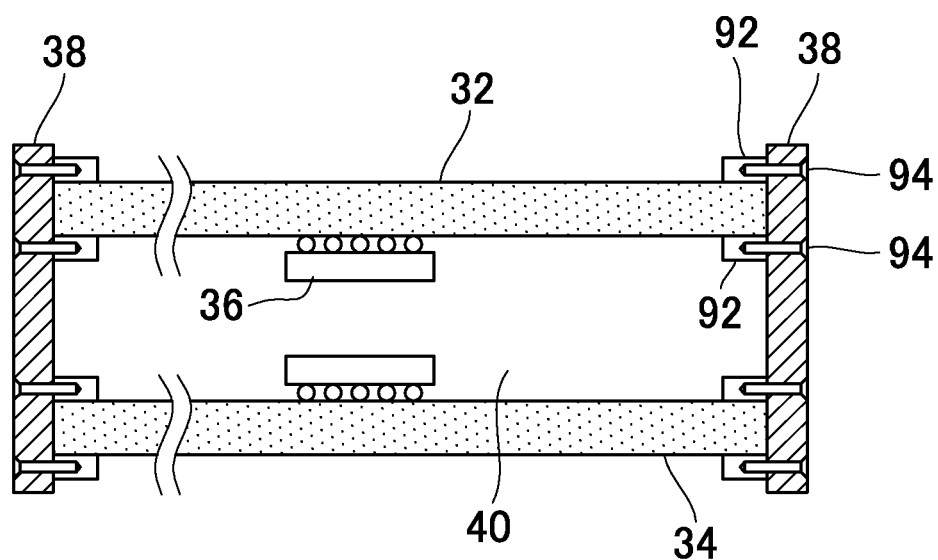
FIG. 13 is a side perspective view of a circuit module 30 according to a sixth embodiment.
Figure 14:
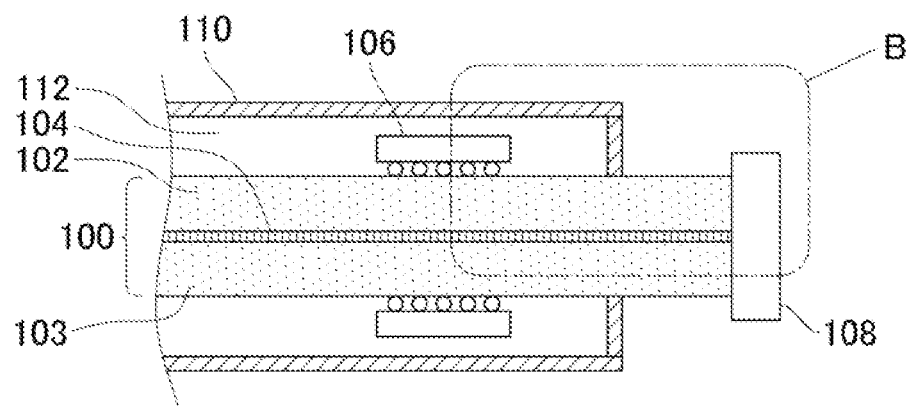
FIG. 14 is a side perspective view of a hitherto known circuit module 30.
Figure 15:
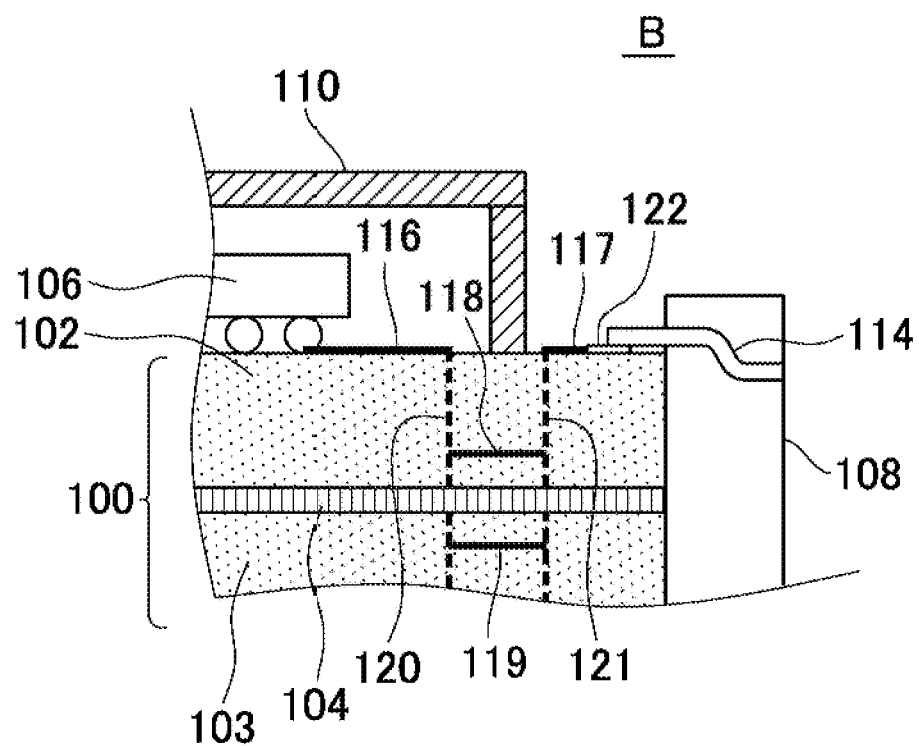
FIG. 15 is an enlarged view of the hitherto known circuit module 30.

FIG. 13 illustrates a configuration example of a circuit module 30 according to a sixth embodiment. In the first embodiment, the coolant flow-channel space 40 in which coolant is filled is formed by sandwiching the sealing section 38 with the first test substrate 32 and the second test substrate 34.

Whereas in this embodiment, as shown in FIG. 13, the sealing section 38 has a tube shape of which through-hole has a cross-sectional shape which is substantially the same as the shapes of the first test substrate 32 and the second test substrate 34. The first test substrate 32 and the second test substrate 34 are arranged to face each other such that the first test circuit 36 and the second test circuit 37 are fit into the coolant flow-channel space 40. Furthermore, the edges of the first test substrate 32 and the second test substrate 34 are fixed to the inner wall of the through-hole of the sealing section 38 by using a gland 92 and a screw 94. With the above-described structure, it is possible to cool the test circuits provided on the first test substrate 32 and the second test substrate 34 with coolant.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before", or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A test apparatus for testing a device under test comprising:
    a first test substrate and a second test substrate that are arranged to face each other;
    a first test circuit that tests the device under test and that is disposed on a side of the first test substrate that faces the second test substrate;
    a second test circuit that tests the device under test and that is disposed on a side of the second test substrate that faces the first test substrate; and
    a sealing section that is formed by sealing a space between the first test substrate and the second test substrate to enclose the first test circuit and the second test circuit in a common space that is filled with coolant, wherein the first test substrate and the second test substrate each include:

a back-side wiring line formed on a back side of the test substrate opposite a side on which the corresponding one of the first test circuit and the second test circuit is provided; and a first through-hole that is formed to extend from a surface on which the corresponding one of the first test circuit and the second test circuit is provided to a surface on which the back-side wiring line is provided, and through which the corresponding one of the first test circuit and the second test circuit is electrically coupled to the back-side wiring line.

2. The test apparatus according to claim 1, wherein the sealing section is provided between the first test substrate and the second test substrate, and has a tube shape in which openings are disposed at ends close to the first test substrate and the second test substrate, and wherein the first test substrate and the second test substrate are disposed such that the sealing section is sandwiched therebetween.

3. The test apparatus according to claim 1, wherein the sealing section has a tube shape in which a through-hole has a cross-sectional shape that is substantially the same as outer shapes of the first test substrate and the second test substrate, and edges of the first test substrate and the second test substrate are respectively fixed to an inner wall of the through-hole.

4. The test apparatus according to claim 1, wherein the first test substrate and the second test substrate are formed to extend such that edges of the first test substrate and the second test substrate are situated outside a region enclosed by the sealing section, the back-side wiring line is provided, on the back side, to extend from a region corresponding to inside of the sealing section to a region corresponding to outside of the sealing section, and the first test substrate and the second test substrate each include:

a connection terminal that is provided outside the sealing section on the side on which the corresponding one of the first test circuit and the second test circuit is provided, and that is electrically coupled to an external circuit; and a second through-hole that is formed to extend from a surface on which the connection terminal is provided to the surface on which the back-side wiring line is provided, and through which the connection terminal and the back-side wiring line are electrically coupled to each other.

5. The test apparatus according to claim 4, further comprising a connector that is interposed between the first test substrate and the second test substrate at an edge of the first test substrate and the second test substrate to be electrically coupled to the connection terminal.

6. The test apparatus according to claim 4, wherein the first test substrate and the second test substrate each have an insulating layer that covers the back-side wiring line on the side on which the back-side wiring line is formed.

7. The test apparatus according to claim 6, wherein a ground electrode layer to which a ground potential is supplied is formed on a surface of the insulating layer.

8. The test apparatus according to claim 1, wherein the first test substrate and the second test substrate each include:

a circuit mounting layer on which the corresponding one of the first test circuit and the second test circuit is mounted, and on which a surface wiring line that is electrically coupled to a terminal of the corresponding one of the first test circuit and the second test circuit is formed; and a strip line layer that is formed above the circuit mounting layer to cover the surface wiring line in a region where the corresponding one of the first test circuit and the second test circuit is not formed, and that has a grounding layer formed on a surface of the strip line layer.

9. The test apparatus according to claim 8, wherein the strip line layer is formed to extend from inside of the sealing section to outside of the sealing section.

10. The test apparatus according to claim 1, further comprising:

a partition wall that is provided to extend from the first test substrate to the second test substrate inside the sealing section, and that forms a flow channel for the coolant; and a fixing section that fixes the partition wall, the first test substrate and the second test substrate.

11. The test apparatus according to claim 1, further comprising a control section that controls each of the first test circuit and the second test circuit.

12. A circuit module that outputs an output signal corresponding to an input signal, the circuit module comprising:

a first circuit substrate and a second circuit substrate that face each other;

a first operation circuit that is provided on a side of the first circuit substrate opposing the second circuit substrate, and that outputs the output signal corresponding to the input signal;

a second operation circuit that is provided on a side of the second circuit substrate opposing the first circuit substrate, and that outputs the output signal corresponding to the input signal; and a sealing section that is formed by sealing a space between the first circuit substrate and the second circuit substrate to enclose the first operation circuit and the second operation circuit in a common space that is filled with coolant, wherein the first circuit substrate and the second circuit substrate each include:

a back-side wiring line formed on a back side of the circuit substrate opposite a side on which the corresponding one of the first operation circuit and the second operation circuit is provided; and a first through-hole that is formed to extend from a surface on which the corresponding one of the first operation circuit and the second operation circuit is provided to a surface on which the back-side wiring line is provided, and through which the corresponding one of the first operation circuit and the second operation circuit is electrically coupled to the back-side wiring line.

* * * * *